United States Patent [19]

Motoda et al.

[11] Patent Number: 5,763,291

[45] Date of Patent: Jun. 9, 1998

[54] METHOD OF MAKING SEMICONDUCTOR LASER

[75] Inventors: Takashi Motoda; Manabu Kato, both of Itami, Japan

[73] Assignee: Mitsubishi Denki Kabushiki Kaisha, Tokyo, Japan

[21] Appl. No.: 523,513

[22] Filed: Sep. 1, 1995

[30] Foreign Application Priority Data

Sep. 5, 1994 [JP] Japan ................... 6-211051

[51] Int. Cl.$^6$ .................................................. H01L 21/00
[52] U.S. Cl. .................. 438/39; 438/31; 438/32; 438/40; 438/47
[58] Field of Search ..................... 438/22, 29, 31, 438/32, 39, 40, 41, 46, 47

[56] References Cited

U.S. PATENT DOCUMENTS

| | | | |
|---|---|---|---|
| 5,105,432 | 4/1992 | Murakami et al. | 372/46 |
| 5,161,167 | 11/1992 | Murakami et al. | |
| 5,177,757 | 1/1993 | Tsugami | |
| 5,189,680 | 2/1993 | Kimura | |
| 5,192,711 | 3/1993 | Murakami et al. | 437/19 |
| 5,272,109 | 12/1993 | Motoda | |
| 5,523,256 | 6/1996 | Adachi et al. | 437/126 |

FOREIGN PATENT DOCUMENTS

| | | |
|---|---|---|
| 0284435 | 9/1988 | European Pat. Off. |
| 0343738 | 11/1989 | European Pat. Off. |
| 0456429 | 11/1991 | European Pat. Off. |
| 4119921 | 1/1992 | Germany |
| 4130536 | 10/1992 | Germany |
| 4210854 | 7/1994 | Germany |
| 1952700 | 2/1996 | Germany |
| 63-17583 | 1/1988 | Japan |
| 258883 | 2/1990 | Japan |
| 2106085 | 4/1990 | Japan |
| 2172287 | 7/1990 | Japan |

OTHER PUBLICATIONS

Antell et al., "Passivation of zinc acceptors in InP by atomic hydrogen coming from arsine during metalorganic vapor phase epitaxy", Appl. Phys. Lett. 53 (9), 29 Aug. 1988, pp. 758–760.

Hamada et al., "Activation of ZN Acceptors in AlGaInP Epitaxial Layers Grown on Misoriented Substrates by Metal Organic Chemical Vapour Deposition", Electronics Letter, vol. 28, No. 6, Apr. 12, 1992.

Nishikawa et al., "Effects of Residual Impurities on Zn Electrical Activity In Zn–Doped InGAAlP Grown by Metalorganic Chemical Vapor Deposition", Journal of Crystal Growth, vol. 123, 1992, pp. 181–187.

Minagawa et al, "Effect of Cap Layer and Cooling Atmosphere on the Hole Concentration of p (Zn)–AlGaInP Grown by Organometallic Vapor Phaser Epitaxy", Journal of Crystal Growth, vol. 118, 1992, pp. 425–429.

*Primary Examiner*—Tuan H. Nguyen
*Attorney, Agent, or Firm*—Leydig, Voit & Mayer, Ltd.

[57] ABSTRACT

A method of fabricating a semiconductor laser producing visible light includes forming a double heterojunction (DH) structure on a GaAs substrate including an n type GaAs buffer layer, an n type AlGaInP cladding layer, an $Al_xGa_{(1-x)}InP$ active layer, a first p type AlGaInP cladding layer, a p type GaInP etch stopping layer, a second p type AlGaInP cladding layer, and a p type GaAs cap layer. A stripe-shaped mask is formed on the DH structure, the p type GaAs cap layer is selectively etched using the mask, and the second p type AlGaInP cladding layer is selectively etched to the p type GaInP etch stopping layer to form a stripe-shaped ridge. Therefore, a high precision ridge can be formed easily.

20 Claims, 9 Drawing Sheets

Fig. 10 (a) Prior Art
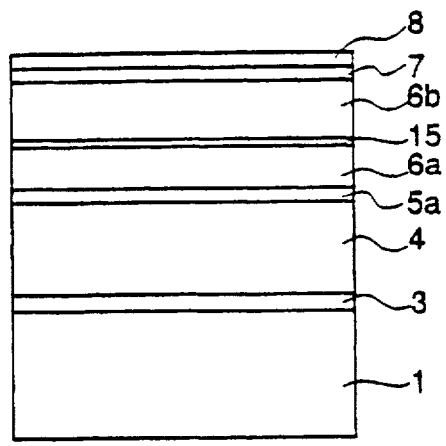
Fig. 10 (d) Prior Art
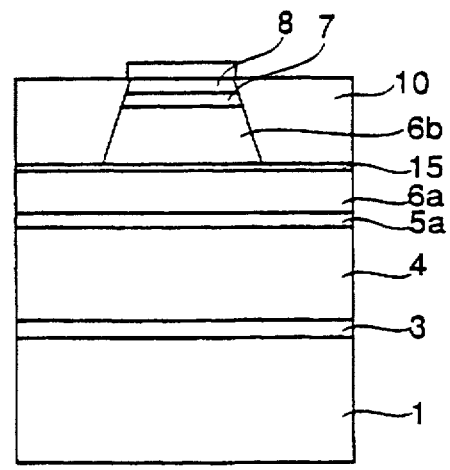
Fig. 10 (b) Prior Art
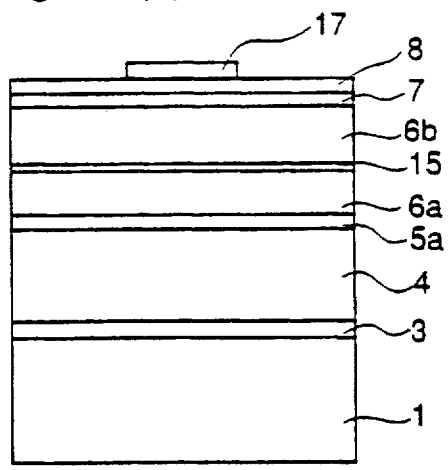
Fig. 10 (e) Prior Art
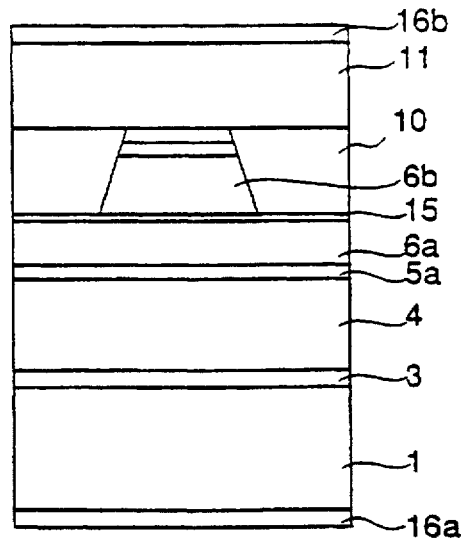
Fig. 10 (c) Prior Art
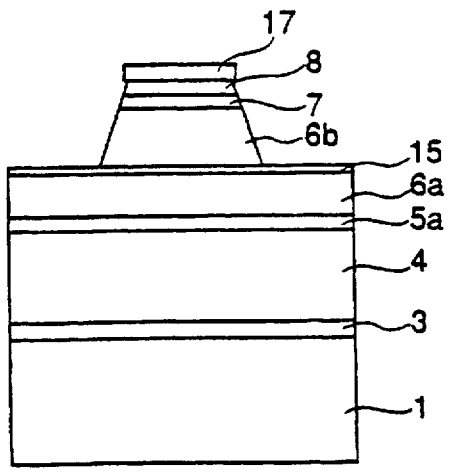

METHOD OF MAKING SEMICONDUCTOR LASER

FIELD OF THE INVENTION

The present invention relates to a method of fabricating a semiconductor layer, a method of fabricating a semiconductor laser, and a semiconductor laser fabricated by the method. More particularly, the invention relates to a structure of a laser diode producing visible light (hereinafter referred to as an LD) including a double heterojunction structure (hereinafter referred to as a DH) with a ridge that can be formed precisely and easily, and a method for fabricating the LD. This invention also relates to a method of enhancing the electrical activation ratio of dopant impurities in a crystalline semiconductor material.

BACKGROUND OF THE INVENTION

FIG. 11 is a sectional view of a prior art LD producing visible light, and FIGS. 10(a)-10(e) are diagrams showing a method for fabricating the LD. First, on an n type GaAs substrate 1, an n type GaAs buffer layer 3, an n type AlGaInP cladding layer 4, a GaInP active layer 5a, a p type AlGaInP cladding layer 6a, a p type GaInP etch stopping layer 15, a p type AlGaInP cladding layer 6b, a p type GaInP band discontinuity relaxing layer 7, and a p type GaAs cap layer 8 are successively grown by MOCVD (FIG. 10(a)). Thereafter, a silicon nitride film or a silicon oxynitride (SiON) film 17 is formed by MOCVD (FIG. 109(b)), resist is deposited, and, by photolithography, a resist mask having a stripe extending in the [011] direction is formed.

Next, the p type GaAs cap layer 8 is selectively etched, using the resist mask, with a tartaric acid series etchant, the p type GaInP band discontinuity relaxing layer 7 is etched with a hydrochloric acid series etchant, and the p type AlGaInP cladding layer 6b is etched to the p type GaInP etch stopping layer 15 with a sulfuric acid series etchant (FIG. 10(c)). Through this process, a stripe-shaped ridge is formed.

Then, an n type GaAs current blocking layer 10 is selectively grown on the sides of the ridge (FIG. 10(d)), the resist mask is removed, a p type GaAs contact layer 11 is grown over all of the surface, and, finally, an n side electrode 16a is formed on the n type GaAs substrate 1 and a p side electrode is formed on the p type GaAs contact layer 11 (FIG. 10(e)).

Heretofore, a semiconductor laser producing red light has had a low potential barrier between the active layer and the p type cladding layer. In order to prevent charge carriers from overflowing from the active layer and into the cladding layer, the carrier concentration of the p type cladding layer must be increased. However, electrical activation of Zn in the Zn doped AlGaInP is suppressed by hydrogen passivation and so it has been difficult to increase the charge carrier concentration. Hydrogen passivation of Zn doped AlGaInP is described in published articles. It is, for example, described that in order to activate Zn, it is necessary to anneal at a high temperature in a hydrogen or nitrogen ambient or to grow an n type cap layer as the uppermost layer.

It is also described in published articles that hydrogen passivation of acceptors and donors in compound semiconductors other than Zn-doped AlGaInP influences electrical activity. However, the mechanism of the hydrogen passivation has not been clarified except that hydrogen radicals are known to contribute to hydrogen passivation.

The inventor considers the mechanism of the hydrogen passivation to occur as described below with reference to FIG. 3. During the growth of a semiconductor layer, $AsH_3$, a source of As, is decomposed into As and a hydrogen radical shown as (H·) in the figure. The hydrogen radical freely enters and leaves the vapor phase and the growing crystalline semiconductor layer. In the prior art fabricating method, in order to prevent As from being desorbed from GaAs after completing the growth, the temperature is reduced while supplying $AsH_3$.

In this process, at a region of sufficiently high temperature, $AsH_3$ is decomposed into As and hydrogen radicals. The hydrogen radicals in the vapor phase are supplied to the crystalline semiconductor layer, and the hydrogen radicals react, forming H—P bonds by breaking Zn—P bonds and, subsequently, returning to hydrogen radicals by breaking the H—P bonds. When the temperature falls gradually, $AsH_3$ is decomposed into As and a hydrogen radical, and the hydrogen radical in the vapor phase is supplied to the crystalline semiconductor layer, as described above. Then, the reaction generating hydrogen radicals, by breaking H—P bonds in the crystalline semiconductor material, is suppressed due to a reduction of the kinetic energy of respective atoms with falling temperature, whereby the H—P bonds remain in the crystalline semiconductor layer.

When the temperature is further reduced, the decomposition of $AsH_3$ stops and the generation of hydrogen radicals stops. Then, the H—P are stable in the crystalline semiconductor layer. Thus, it is considered that when the Zn—P bond is broken, Zn is prevented from being electrically activated.

Hydrogen passivation is overcome by electrically activating Zn in Zn-doped AlGaInP by annealing. When Zn-doped AlGaInP is elevated in temperature in a hydrogen or nitrogen ambient, Zn—P bonds are reformed by breaking H—P bonds, and hydrogen radicals are produced. The vapor phase includes hydrogen molecules ($H_2$) or nitrogen molecules ($N_2$), and the hydrogen radicals produced in the crystalline semiconductor layer are released into the vapor phase. While the temperature is being lowered, the hydrogen radicals in the vapor phase (H·) form hydrogen molecules ($H_2$) and the concentration of hydrogen radicals in the vapor phase and in the crystalline layer are reduced. Thus, the hydrogen radicals in the crystalline layer are successively emitted into the vapor phase. Since the hydrogen radicals are expelled from the crystalline layer, the Zn—P bonds in the crystal material remain, and Zn atoms in the crystalline material are electrically activated.

A method of preventing hydrogen passivation, using an n type cap layer, is described. When an n type cap layer is grown on a p type layer, a built-in potential barrier is present between the p type layer and the n type cap layer. Since the supply of the hydrogen radicals from the vapor phase to the p type layer is suppressed, no H—P bonds are formed, and the Zn—P bonds remain stable. Thus, the Zn in the crystalline material is electrically activated.

The method of fabricating the prior art LD is as described above. In forming a ridge by the method described above, there is no etchant that selectively etches GaInP and does not etch AlGaInP. While etching the p type AlGaInP band discontinuity relaxing layer 7 with the hydrochloric acid series etchant, the second p type AlGaInP layer 6b is also etched. Therefore, between LDs that are formed on the wafer surface at the same time, there is a variation in the remaining thickness of the AlGaInP cladding layer 6b. While subsequently etching the AlGaInP layer 6b with a sulfuric acid series etchant, since the selectivity in etching AlGaInP and GaInP of the sulfuric acid series etchant is small, the etching reaches the p type GaInP etch stopping layer 15, and it has been difficult to form the ridge with high precision.

In addition, in order to prevent charge carriers from overflowing from the active layer into the cladding layer, it is necessary to increase the carrier concentration in the p type cladding layer. However, when the LD is fabricated by the prior art method and annealed at an elevated temperature, Zn in the p type AlGaInP layer, forming the upper and lower cladding layers in the LD, diffuses into the active layer.

When an n type cap layer is grown, it is required that the n type cap layer be capable of being selectively etched or that an etch stopping layer for selective etching of the n type cap layer be grown, so that the complexity of the process of etching the n type cap layer and the etch stopping layer is inevitably increased.

SUMMARY OF THE INVENTION

The object of the present invention is to provide a laser structure in which a high precision ridge can be formed easily.

It is another object of the present invention to provide a method of fabricating a semiconductor layer, a method of fabricating a semiconductor laser with an increased dopant activation ratio and precision, avoiding hydrogen passivation of dopant impurities in the compound semiconductor, and a semiconductor laser fabricated by this method.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a method of fabricating a semiconductor laser producing visible light and comprising a DH structure includes growing on a GaAs substrate a DH comprising an n type GaAs buffer layer, an n type AlGaInP cladding layer, an $Al_xGa_{(1-x)}InP$ active layer, a first p type AlGaInP cladding layer, a p type GaInP etch stopping layer, a second p type AlGaInP cladding layer, and a p type GaAs cap layer; forming a stripe-shaped mask on the double heterojunction structure; selectively etching the p type GaAs cap layer using the mask; and selectively etching the second p type AlGaInP cladding layer to reach the p type GaInP etch stopping layer, thereby forming a stripe-shaped ridge. Thus, a high precision ridge is formed easily.

According to a second aspect of the present invention, in the fabricating method, the process of forming the mask includes forming a stripe-shaped mask in the forward mesa direction and forming the stripe-shaped ridge; selectively growing $Al_xGa_{(1-x)}InP$ layers on both sides of the stripe-shaped ridge and removing the mask; selectively etching the p type GaAs cap layer; and successively growing a p type GaInP band discontinuity relaxing layer and a p type GaAs contact layer. Therefore, a high precision LD is formed easily.

According to a third aspect of the present invention, a semiconductor laser is fabricated by the described method. A high precision LD is obtained.

According to a fourth aspect of the present invention, the method of fabricating a semiconductor laser includes, after forming the ridge, removing the selective mask; selectively etching the p type GaAs cap layer; burying the ridge with an undoped GaInP layer; diffusing Zn into the undoped GaInP layer at an upper part of the ridge; and growing a p type GaAs contact layer on the undoped GaInP layer in which Zn is present. Therefore, a high precision LD is formed easily.

According to a fifth aspect of the present invention, a semiconductor laser is fabricated by the described fabricating method. A high precision LD is obtained.

According to a sixth aspect of the present invention, the method of fabricating a semiconductor laser includes, after forming the ridge, removing the mask; selectively etching the p type GaAs cap layer; burying the ridge with the current blocking layer; etching the current blocking layer to the surface of the second p type AlGaInP cladding layer on the upper surface of the ridge; and growing a p type GaInP band discontinuity relaxing layer and a p type GaAs contact layer. Therefore, a high precision LD is formed easily.

According to a seventh aspect of the present invention, a semiconductor laser is fabricated by the described method. Therefore, a high precision LD is obtained easily.

According to an eighth aspect of the present invention, the method of fabricating a semiconductor laser includes, after forming the ridge, removing the mask; burying the ridge with the current blocking layer; removing the current blocking layer at an upper part of the ridge to the surface of the cap layer; selectively etching the cap layer to the surface of the second p type AlGaInP cladding layer; and forming a p type GaInP band discontinuity relaxing layer and a p type GaAs contact layer. A high precision LD is formed easily.

According to a ninth aspect of the present invention, a semiconductor laser is fabricated by the described method. A high precision LD is obtained.

According to a tenth aspect of the present invention, in the described method of fabricating a semiconductor laser, the stripe-shaped mask is formed in the reverse mesa, i.e., [011], direction. Therefore, the shape of the ridge is changed.

According to a eleventh aspect of the present invention, a semiconductor laser is fabricated by the described fabrication method. A high precision LD with a different shaped ridge is obtained.

According to a twelfth aspect of the present invention, a method of fabricating a semiconductor laser includes, after growing the DH, forming the stripe-shaped mask in the reverse mesa, i.e., [011], direction; after forming a ridge by selective etching, removing the mask; and successively growing the n type GaAs current blocking layer, the p type GaInP band discontinuity relaxing layer, and the p type GaAs contact layer. Therefore, a high precision LD is produced easily.

According to a thirteenth aspect of the present invention, a semiconductor laser is fabricated by the described fabricating method. A high precision LD is formed.

According to a fourteenth aspect of the present invention, in the method of fabricating a semiconductor laser, the etchant that selectively etches the p type GaAs cap layer is a tartaric acid series etchant, and the etchant that selectively etches the p type AlGaInP cladding layer to the p type GaInP etch stopping layer is a sulfuric acid series etchant. Therefore, the selectivity of the etchant with respect to respective layers in the etching process is increased.

According to a fifteenth aspect of the present invention, in the method of fabricating a semiconductor layer, use of a source gas that generates hydrogen radicals during growth of the surface layer of the semiconductor material or during cooling after the growth, including an element of the semiconductor material, is stopped. Therefore, the dopant impurities in the compound semiconductor are not subjected to hydrogen passivation.

According to a sixteenth aspect of the present invention, in the method of fabricating a semiconductor laser, use of a source gas that generates hydrogen radicals during growth of the p type GaAs cap layer and the p type GaAs contact layer or during cooling after growth, and including an element of the semiconductor material, is stopped. Therefore, the dopant impurities in the compound semiconductor are not subjected to hydrogen passivation.

According to a seventeenth aspect of the present invention, the method of fabricating the semiconductor layer avoids, after the growth of the surface layer of the semiconductor material, during cooling without hydrogen passivation, decomposition of hydrides of an element of the semiconductor material. Therefore, the dopant impurity in the compound semiconductor is not subjected to hydrogen passivation.

According to a eighteenth aspect of the present invention, the method of fabricating semiconductor laser avoids, after the growth of the p type GaAs cap layer and the p type GaAs contact layer, during cooling without hydrogen passivation, decomposition of hydrides of an element of the semiconductor material. Therefore, dopant impurities in the compound semiconductor material are not subjected to hydrogen passivation.

According to a nineteenth aspect of the present invention, in the method of fabricating a semiconductor layer, after growth, an organometallic compound material including an element that does not generate hydrogen radicals and is included in the semiconductor material is used as the ambient to prevent the element of the semiconductor material from desorbing during cooling. Therefore, no hydrogen radicals are generated, and dopant impurities in the compound semiconductor material are not subjected to hydrogen passivation.

According to a twentieth aspect of the present invention, in the method of fabricating a semiconductor laser, after growth of the p type GaAs cap layer and the p type GaAs contact layer, an organometallic compound material that does not generate hydrogen radicals and includes an element of the semiconductor material is used as the ambient to prevent the element of the semiconductor material from desorbing during cooling. Therefore, hydrogen radicals are not generated, and dopant impurities in the compound semiconductor material are not subjected to hydrogen passivation.

According to a twenty-first aspect of the present invention, in the method of fabricating a semiconductor layer, an organometallic compound material that does not generate hydrogen radicals and includes an element forming the semiconductor layer is used as the ambient in growing the semiconductor layer. Therefore, generation of hydrogen radicals that have an effect on dopant impurities in the compound semiconductor layer is prevented.

According to a twenty-second aspect of the present invention, in the method of fabricating a semiconductor laser, during growth of the p type GaAs cap layer and the p type GaAs contact layer, an organometallic compound that does not generate hydrogen radicals, including an element of the semiconductor material is used as an ambient for growing the semiconductor material. Therefore, generation of hydrogen radicals that have an effect on dopant impurities in the compound semiconductor material is prevented.

According to a twenty-third aspect of the present invention, in the method of fabricating a semiconductor layer, a semiconductor is grown by molecular beam epitaxy. Therefore, generation of hydrogen radicals that have an effect on dopant impurities in the compound semiconductor material is prevented.

According to a twenty-fourth aspect of the present invention, in the method of fabricating a semiconductor laser, the p type GaAs cap layer and the p type GaAs contact layer are grown by molecular beam epitaxy. Therefore, generation of hydrogen radicals that have an effect on dopant impurities in the compound semiconductor is prevented.

According to a twenty-fifth aspect of the present invention, in the method of fabricating a semiconductor laser, the current blocking layer comprises an n type $Al_xGa_{(1-x)}InP$ layer (Al composition x is $0 \leq x \leq 1$). Therefore, the selectivity of the cap layer relative to the current blocking layer in the etching process is increased, whereby a high precision LD is easily obtained.

According to a twenty-sixth aspect of the present invention, in the method of fabricating a semiconductor laser, the current blocking layer comprises a high resistance $Al_xGa_{(1-x)}InP$ layer (Al composition x is $0 \leq x \leq 1$). Therefore, the selectivity of the cap layer relative to the current blocking layer in the etching process is increased, whereby a high precision LD is easily obtained.

According to a twenty-seventh aspect of the present invention, in the method of fabricating a semiconductor laser, the current blocking layer comprises two layers, that is, a material that is not etched during etching of the p type GaAs cap layer and located at the uppermost surface of the current blocking layer. Therefore, the selectivity of the cap layer relative to the current blocking layer in the etching process is increased, whereby a high precision LD is easily obtained.

According to a twenty-eighth aspect of the present invention, in the method of fabricating a semiconductor laser, the current blocking layer comprises a repeated two-layer structure of a semiconductor material that is not etched when the p type GaAs cap layer is etched and located at the uppermost surface of the current blocking layer. Therefore, the selectivity of the cap layer relative to the current blocking layer in the etching process is increased, whereby a high precision LD is obtained easily.

According to a twenty-ninth aspect of the present invention, in the method of fabricating a semiconductor laser, the current blocking layer comprises a semiconductor material that is not etched when the p type GaAs cap layer is etched and located at the surface, the lower layer is a multi-layer structure or a superlattice structure, and the thickness of respective layers produces a predetermined light confining efficiency in a transverse direction. Therefore, the selectivity of the cap layer relative to the current blocking layer in the etching process is enhanced, whereby a high precision LD having a predetermined light emission efficiency is obtained.

According to a thirtieth aspect of the present invention, in the method of fabricating a semiconductor laser, the surface layer of the current blocking layer comprises $Al_xGa_{(1-x)}InP$, and the lower layer is a GaAs series material, and the $Al_xGa_{(1-x)}InP$ layer is an n type, p type, undoped, or a high resistance layer. Therefore, the selectivity of the cap layer relative to the current blocking layer in the etching process is enhanced, whereby a high precision ridge is easily formed.

According to a thirty-first aspect of the present invention, in the method of fabricating a semiconductor laser, p type Ge is used as the contact layer of the LD structure. Therefore, the resistance of the contact layer is decreased.

According to a thirty-second aspect of the present invention, in the method of fabricating a semiconductor layer, the semiconductor material comprises GaAs and the organometallic compound material is trimethyl arsine (TMAs) or tributyl arsenide (TBAs). Therefore, generation of hydrogen radicals during growth of the semiconductor material or during cooling is prevented.

According to a thirty-third aspect of the present invention, in the method of fabricating a semiconductor laser, the semiconductor material comprises GaAs and the organometallic compound material is trimethyl arsine (TMAs) or tributyl arsenide (TBAs). Therefore, generation of hydrogen radicals during growth of the semiconductor materials or during cooling is prevented.

BRIEF DESCRIPTION OF THE DRAWINGS

FIGS. 10(a)–10(e) are diagrams illustrating steps in fabricating a semiconductor laser according to a prior art method.

DETAILED DESCRIPTION OF THE PREFERRED EMBODIMENTS

EMBODIMENT 1

Figure 1:
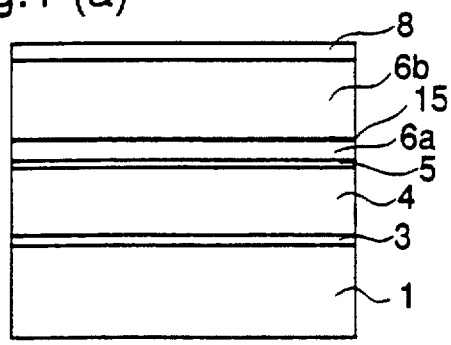
FIGS. 1(a)–1(g) are diagrams illustrating process steps in fabricating a semiconductor laser according to a first embodiment of the invention.
Figure 1:
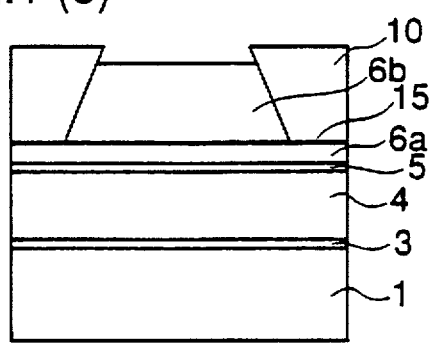
Figure 1:
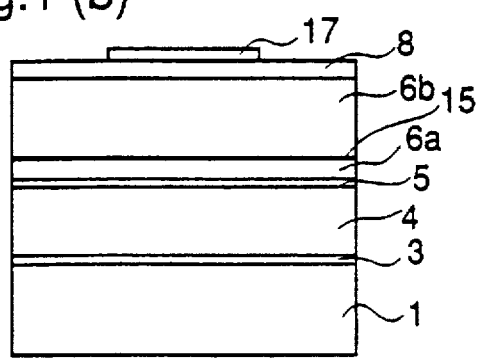
Figure 1:
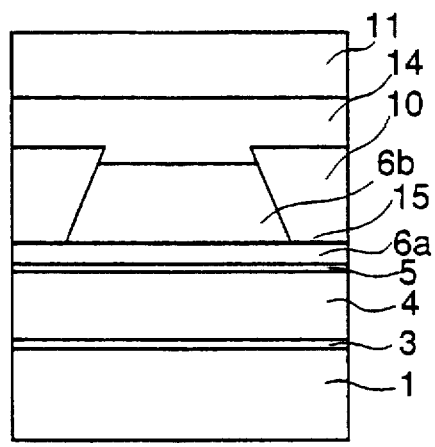
Figure 1:
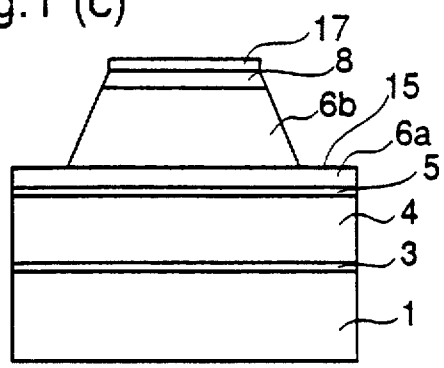
Figure 1:
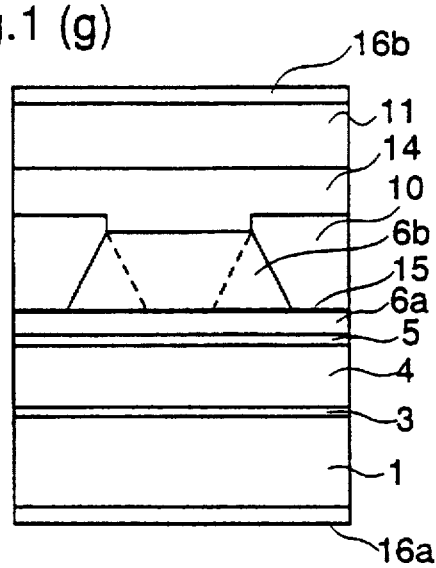
Figure 1:
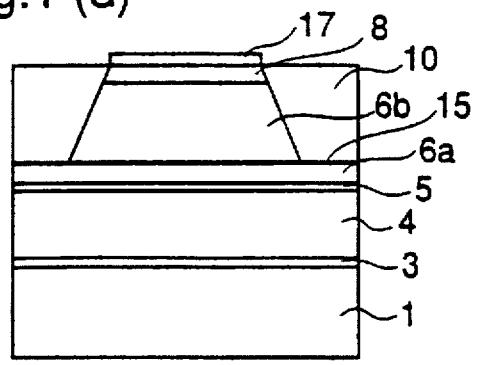

FIGS. 1(a)–1(g) are diagrams illustrating processes in the fabrication of a semiconductor laser according to a first embodiment of the invention. In the step of FIG. 1(a), a DH laser that does not include a p type GaInP band discontinuity relaxing layer includes an n type GaAs buffer layer 3, an n type AlGaInP cladding layer 4, an $Al_xGa_{(1-x)}InP$ active layer 5, a first p type AlGaInP cladding layer 6a, a p type GaInP etch stopping layer 15, a second p type AlGaInP cladding layer 6b, and a p type GaAs cap layer 8 grown on the GaAs substrate 1 (FIG. 1(a)).

When the p type GaAs cap layer 8 is grown on the second p type AlGaInP cladding layer 6b, a semiconductor layer may be grown as an alternative, which will be described later, whereby the electrical characteristics of a semiconductor layer are improved.

An insulating film, such as SiN, SiO, and SiON, is grown on the cap layer 8 and, by photolithography, a stripe-shaped mask 17 is formed (FIG. 1(b)). Then, using this mask, the p type GaAs cap layer 8 is selectively etched with a tartaric acid series etchant. This etching is stopped certainly at the surface of the p type AlGaInP cladding layer 6b. The p type AlGaInP cladding layer 6b is etched to the p type GaInP etch stopping layer 15 with a sulfuric acid series etchant. The stripe-shaped ridge as shown in FIG. 1(c) is thereby formed.

The current blocking layer 10 of $Al_xGa_{(1-x)}InP$ is selectively grown. The mask 17 is removed, and the p type GaAs cap layer 8 is etched and removed with the tartaric acid series etchant (FIG. 1(e)). Thereafter, a p type GaInP band discontinuity relaxing layer 14 and a p type GaAs contact layer 11 are successively grown. Finally, the electrodes 16a and 16b are formed, and the wafer is separated into LD elements of predetermined size.

Figure 2:
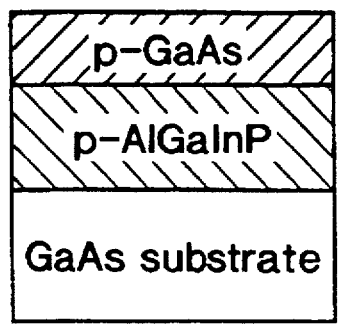
FIG. 2 is a diagram explaining an alternative in which hydrogen passivation is prevented in the first embodiment of the invention.

As an alternative to this fabricating method, the dopant impurity in the compound semiconductor is not subjected to hydrogen passivation when the P type GaAs cap layer 8 is grown on the second p type AlGaInP cladding layer 6b. FIG. 2 shows a crystalline structure in which the carrier concentration in the p type AlGaInP layer is measured, and a p type GaAs layer contacting the p type AlGaInP layer.

Figure 3:
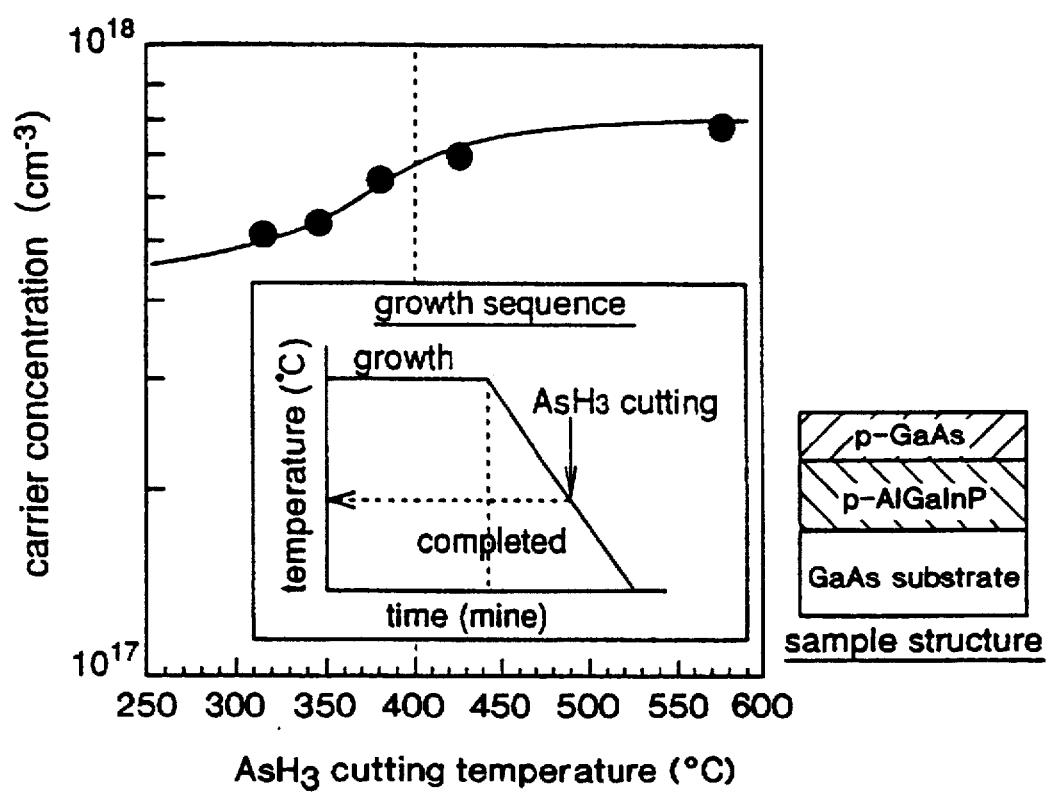
FIG. 3 is a diagram explaining an alternative in which hydrogen passivation is prevented in the first embodiment of the invention.

FIG. 3 shows the relationship between the temperature at which $AsH_3$ is decomposed while the temperature is falling, after the sample structure in FIG. 2 is grown, and the carrier concentration obtained from Hall measurements of the p type AlGaInP layer. Below 500° C., i.e., below the temperature of decomposition of $AsH_3$, the carrier concentration is reduced, eminently producing hydrogen passivation.

Figure 4:
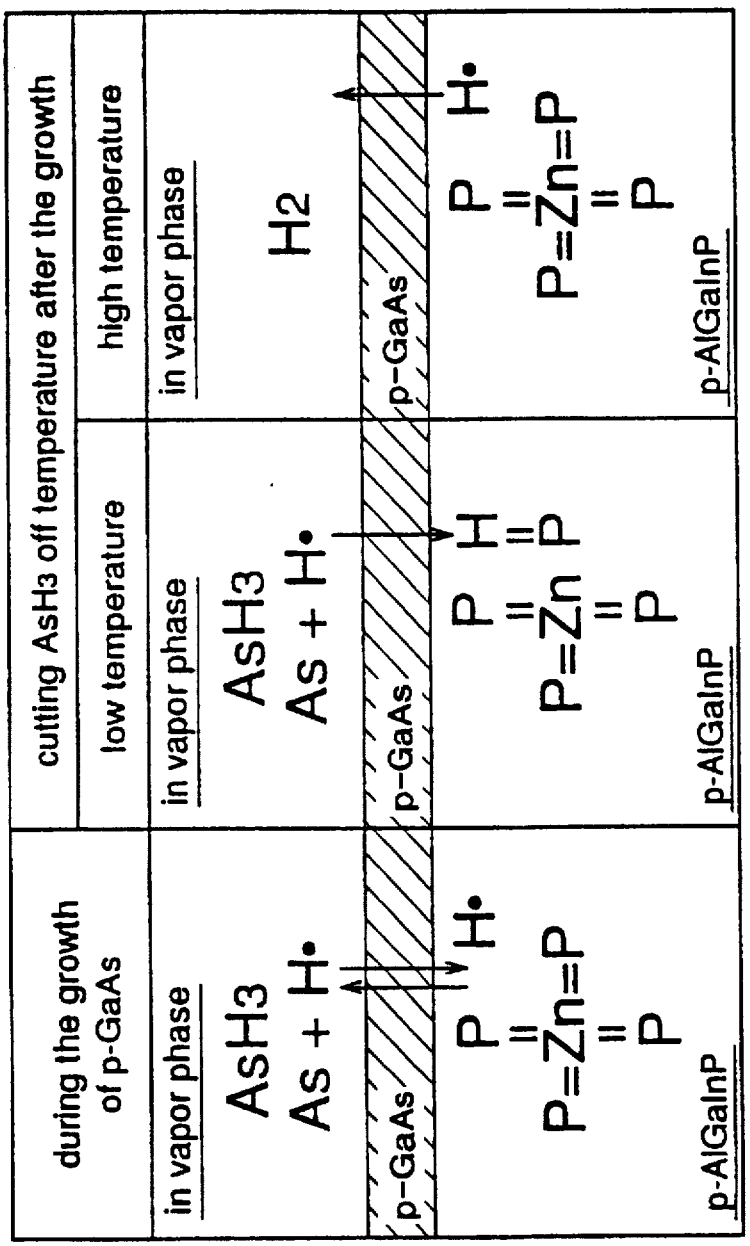
FIG. 4 is a diagram explaining an alternative in which hydrogen passivation is prevented in the first embodiment of the invention.

A description is given of hydrogen passivation dependency on temperature from the results of FIG. 3. At temperatures above 500° C., at which $AsH_3$ is decomposed, since no change is produced in the carrier concentration, the hydrogen radicals in the crystal have enough kinetic energy to form an H—P bond upon breaking of a Zn—P bond or to return to a hydrogen radical upon breaking of an H—P bond. The movements of respective atoms surrounding the hydrogen atoms are as shown in the "during the growth of p type GaAs" in FIG. 4. It is considered that in this temperature region, since, when the supply of $AsH_3$ is stopped, the hydrogen radicals generated by decomposition of $AsH_3$ in the vapor phase are exhausted, the hydrogen radicals that were present or generated upon breaking of H—P bonds in the crystal are emitted into the vapor phase. Thus, the bonds between Zn and P are reestablished, and Zn is electrically activated as shown at the right side of FIG. 4.

In the temperature region of 350°–500° C., the hydrogen radicals form H—P bonds upon breaking Zn—P bonds. However, the kinetic energy of the respective atoms is reduced in this temperature region as compared with the temperature region above 500° C. When the supply of $AsH_3$ is stopped in this temperature region, hydrogen returning to hydrogen radicals upon breaking of H—P bonds is limited, and the H—P bonds in the crystal when the supply of $AsH_3$ is stopped remain.

In the temperature region below 350° C., the kinetic energy of the hydrogen radicals in the crystal is reduced, and the Zn—P bond or H—P bonds remain intact.

The reactions of respective atoms related to this hydrogen passivation are reversible reactions, so that hydrogen passivation must be prevented in the final step of the annealing process.

Examples of a fabricating method applied to the fabrication of an LD are described. First of all, as an alternative 1, a description is given of the method of FIGS. 1(a)–1(g), sectional views illustrating the fabrication process of an LD. A buffer layer 3, a cladding layer 4, an active layer 5, a first cladding layer 6a, an etch stopping layer 15, and a second p type AlGaInP cladding layer 6b are successively grown on the n type GaAs substrate 1. A p type GaAs cap layer 8 that has the structure shown in FIG. 2 is grown on this p type AlGaInP cladding layer 6b. After cap layer 8 is grown, the supply of $AsH_3$ is stopped during cooling at a temperature above the temperature at which hydrogen passivation occurs, whereby the electrically activated proportion of the Zn included in the second p type AlGaInP cladding layer 6b is increased.

In addition, when the p type GaAs contact layer 11 is grown on the p type GaInP band discontinuity relaxing layer 14, the electrically activated proportion of dopant impurities in the band discontinuity relaxing layer 14 and the carrier concentration in the second p type AlGaInP cladding layer 6b are increased through the same mechanism.

Descriptions are given of other alternatives in which the dopant impurity in the semiconductor layer is not subjected to hydrogen passivation. In this alternative 2, an As source material that does not generate hydrogen radicals, for example, tributyl arsine (TBA), trimethyl arsine (TMA), or the like, is used as the organometallic arsenic source material during cooling, after growing the p type GaAs cap layer 8 or the p type GaAs contact layer 11 or regrowing them on the uppermost surface layer.

After growing the p type GaAs cap layer 8 or regrowing the p type GaAs contact layer 11 during cooling, an As compound that decomposes and does not generate hydrogen radicals, for example, TBAs, TMAs, or the like, is used as the organometallic arsenic source material instead of using $AsH_3$. In this way, hydrogen radicals that break Zn—P bonds are not generated and have no effect, whereby the electrically activated proportion of Zn in the crystal is increased.

As an alternative 3, a description is given of an example of crystalline growth using an As source material that does not generate hydrogen radicals, for example, TBAS, TMAs, or the like, when the p type GaAs cap layer 8 is grown or a p type GaAs contact layer 11 is regrown. In this way, hydrogen radicals that break Zn—P bonds at the lower layer of the uppermost surface layer are not generated during the crystalline growth step and have no effect on Zn—P bonds in the crystal.

An example of growing of the p type GaAs cap layer 8 on the uppermost surface layer or regrowing of the p type GaAs contact layer 11 employing molecular beam epitaxy (MBE) is represented as an alternative 4. The As compound used as the As source material does not include hydrogen radicals, and it has no effect on Zn—P bonds in the layer directly below the grown layer.

In the MBE method, since GaAs can be grown at a low temperature (the temperature is discretionary), the epitaxial layer, before the growth of the p type GaAs layer, has no hydrogen passivation. However, when the epitaxial layer is grown before the regrowth of the p type GaAs layer, because of the hydrogen passivation, it is necessary to anneal the epitaxial layer at a temperature above the temperature at which the hydrogen radicals are emitted into the vapor phase, breaking P—H bonds, before the growth in the MBE furnace or to grow the epitaxial layer before the regrowth by MBE.

In these alternatives 1 to 4, not using a source material gas that generates hydrogen radicals during growth of the uppermost surface layer or during cooling after the growth prevents the dopant impurities in the semiconductor layer from being subjected to hydrogen passivation, whereby the proportion of electrically active dopant impurities is increased.

These alternatives 1 to 4 can also be applied when the p type GaAs cap layer and the p type GaAs contact layer are formed in embodiments 2 to 6.

The current blocking layer 10 used in this embodiment 1 is a material that is not etched by the tartaric acid series etchant when the p type GaAs cap layer 8 is etched with tartaric acid. For example, n type $Al_xGa_{(1-x)}InP$ ($0 \leq x \leq 1$) or high resistance $Al_xGa_{(1-x)}InP$ is used. High resistance $Al_xGa_{(1-x)}InP$ is undoped or includes oxygen. The Al composition x of $Al_xGa_{(1-x)}InP$ is $0 \leq x \leq 1$, and the concentration of oxygen is more than $10^{16}/cm^3$.

The current blocking layer 10 can also have a multi-layer structure, not the single layer of $Al_xGa_{(1-x)}InP$ as above described. A description is given of an alternative in which the current blocking layer has a multi-layer structure.

When the current blocking layer 10 has a multi-layer structure, a crystalline material that is not etched when the p type GaAs cap layer 8 is etched is present at the uppermost surface layer of the current blocking layer, a surface contacted by the cap layer. In the structure described, a GaAs series crystalline material or the like, i.e., a crystalline material that is etched by the etchant that etches the p type GaAs cap layer 8, can be used as the lower layer of the current blocking layer.

For example, as an alternative 1, the current blocking layer 10 has a two-layer structure. The uppermost layer of the current blocking layer 10 comprises $Al_xGa_{(1-x)}InP$ ($0 \leq x \leq 1$) (any of p type, n type, undoped, and high resistance can be used), and the lower layer is n type or has a high resistance. In other words, the layers comprise ($Al_xGa_{(1-x)}$InP/an n type conductivity crystalline material) or ($Al_xGa_{(1-x)}$InP/a high resistance crystalline material). The n type GaAs, n type $Al_xGa_{(1-x)}As$, and n type $Al_xGa_{(1-x)}InP$ are applied to the n type conductivity crystals to combine with $Al_xGa_{(1-x)}InP$. Undoped $Al_xGa_{(1-x)}InP$, $Al_xGa_{(1-x)}InP$ including oxygen, undoped $Al_xGa_{(1-x)}As$, $Al_xGa_{(1-x)}As$ including oxygen, $Al_xIn_{(1-x)}As$, and Fe doped InP may be used as high resistance crystalline materials.

As an alternative 2, the current blocking layer 10 has a two-layer structure. However, the uppermost layer of the current blocking layer 10 comprises $Al_xGa_{(1-x)}InP$ ($0 \leq x \leq 1$) (any of p type, n type, undoped, and high resistance can be used). A multi-layer structure including the two-layer structure of alternative 1 repeated more than twice may also be used.

The current blocking layer may have a three layer structure as an alternative 3. The uppermost layer of the current blocking layer 10 comprises $Al_xGa_{(1-x)}InP$ ($0 \leq x \leq 1$) (any of p type, n type, undoped, and high resistance can be used), and the lowermost layer comprises an n type or a high resistance crystalline material. Any semiconductor can be used for the layer between the uppermost and lowermost layers.

The current blocking layer 10 comprises ($Al_xGa_{(1-x)}InP$/semiconductor/n type conductivity semiconductor) or ($Al_xGa_{(1-x)}InP$/semiconductor/high resistance semiconductor). The same n type conductivity crystalline material and high resistance crystalline material are used as in alternative 1.

As an alternative 4, the current blocking layer 10 has a multi-layer structure and a superlattice structure. Thereby, it is possible to adjust the thickness of respective layers, control the light confining efficiency in the transverse direction, and increase the light emission efficiency of the laser. The multi-layer structure and the superlattice structure are represented as follows.

AlGaInP/GaInP, $Al_xGa_{(1-x)}InP/Al_yGa_{(1-y)}InP$ ($0 \leq x \leq 1$, $0 \leq y \leq 1$), AlGaInP/GaAs, and $Al_xGa_{(1-x)}InP/Al_yGa_{(1-y)}As$ ($0 \leq x \leq 1$, $0 \leq y \leq 1$).

AlGaAs/AlGaAs, $Al_xGa_{(1-x)}As/Al_yGa_{(1-y)}As$ ($0 \leq x \leq 1$, $0 \leq y \leq 1$), GaInAsP/GaInAsP, and $Ga_{(x1)}In_{(1-x1)}As_{(y1)}P_{(1-y1)}$/$Ga_{(x2)}In_{(1-x2)}As_{(y2)}P_{(1-y2)}$ ($0 \leq x1 \leq 1$, $0 \leq y1 \leq 1$), ($0 \leq x2 \leq 1$, $0 \leq y2 \leq 1$).

In a current blocking layer having a multi-layer structure or a superlattice structure, the material of the lower layers can be selected arbitrarily as $Al_xGa_{(1-x)}InP$ ($0 \leq x \leq 1$) or the like for the uppermost layer of the current blocking layer, i.e., a material that is not etched when the p type GaAs cap layer is etched.

In the method of fabricating the semiconductor laser according to embodiment 1, the DH does not include the p type GaInP band discontinuity relaxing layer 7 and is grown on the GaAs substrate 1, the stripe-shaped mask 17 is formed on the DH, and the p type GaAs cap layer 8 is selectively etched using the tartaric acid series etchant and the mask 17. Thereafter, the p type AlGaInP cladding layer 6a is etched to the p type GaInP etch stopping layer and, after forming the stripe-shaped ridge, the current blocking layer 10 comprising $Al_xGa_{(1-x)}InP$ is selectively grown on both sides of the stripe-shaped ridge. The mask 17 is removed, and, after the p type GaAs cap layer 8 is selectively etched, the band discontinuity relaxing layer 14 and the contact layer 11 are successively grown. The use of source material gases including elements comprising the respective layers and that generate hydrogen radicals is stopped when the cap layer 8 and the contact layer 11 are growing and during cooling after the growth, whereby a laser ridge is formed accurately and easily, the electrically active proportion of the dopant impurity is increased, and a semiconductor laser is produced.

EMBODIMENT 2

Embodiment 2 relates to the method of fabricating an LD in which the process, after forming the ridge, is changed. The entire ridge is buried by the current blocking layer in embodiment 1, and the DH structure does not include the band discontinuity relaxing layer in the first growth.

FIGS. 5(a)–5(e) are diagrams illustrating fabricating process steps of embodiment 2, and the same reference numerals as those in FIGS. 1(a)–1(g) designate the same or corresponding elements. Reference numeral 21 designates an undoped GaInP current blocking layer, reference numeral 22 designates a Zn diffusion region, reference numeral 23 designates an insulating film used as a mask for vapor phase diffusion, and reference numeral 22a designates a removed portion of the insulating film. A description is given of the fabrication process.

A DH structure that does not include the band discontinuity relaxing layer is grown through the same process as in embodiment 1. The ridge is formed through the same process as in embodiment 1 (FIG. 1(c)).

Figure 5:
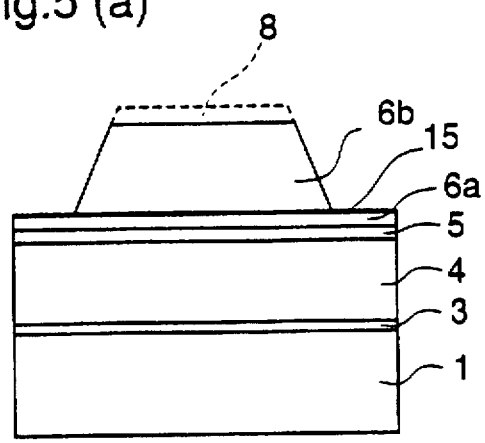
FIGS. 5(a)–5(e) are diagrams illustrating steps in fabricating a semiconductor laser according to a second embodiment of the invention.
Figure 5:
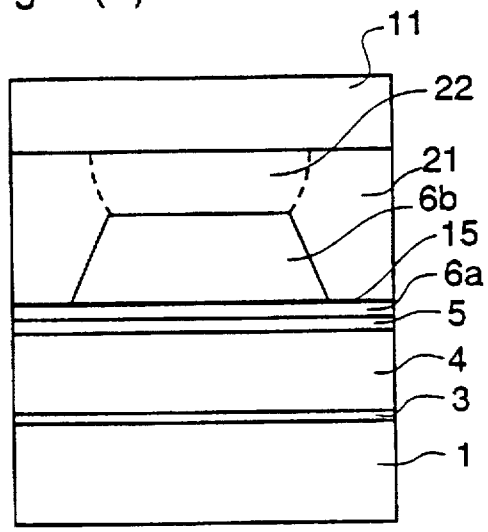
Figure 5:
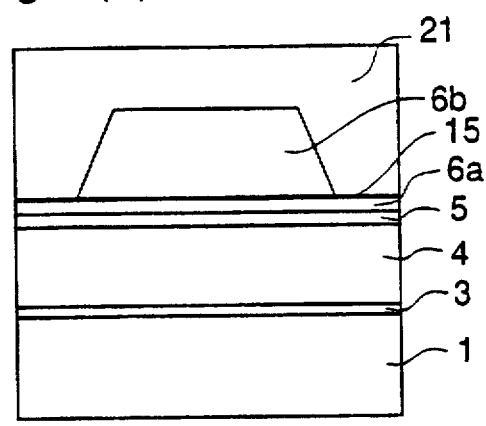
Figure 5:
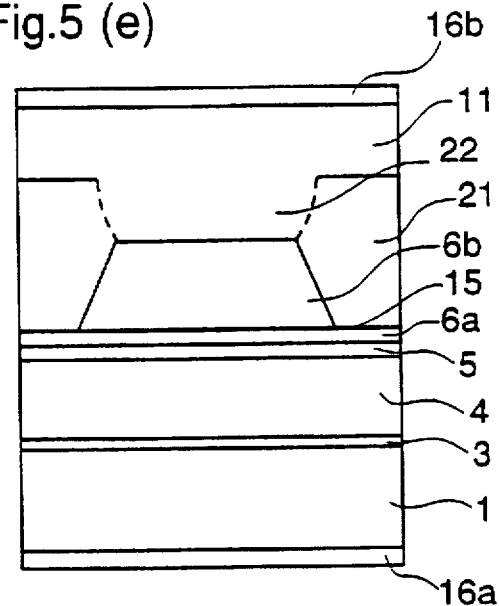
Figure 5:
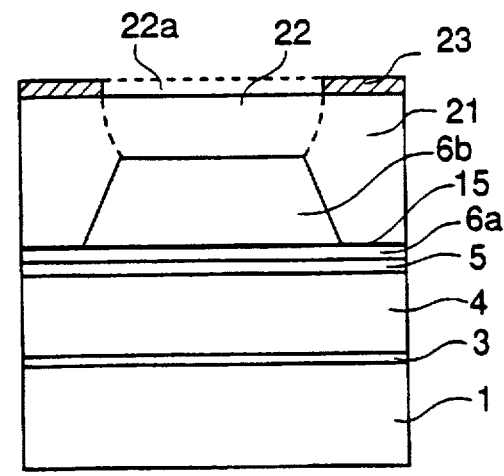

The mask 17 is removed and the p type GaAs cap layer 8 is etched using the tartaric acid series etchant (FIG. 5(a)). The entire ridge is buried by the undoped GaInP layer 21 (FIG. 5(b)). Zn is diffused into the surface of the p type AlGaInP layer 6b of the upper part of ridge by a method described later (FIG. 5(c)). Thereafter, the p type GaAs contact layer 11 is grown (FIG. 5(d)).

Lastly, the electrodes 16a and 16b are formed (FIG. 5(e)), and the wafer is separated into LD elements. In addition, two kinds of Zn diffusion processes, vapor phase diffusion and solid phase diffusion, may be used.

First, vapor phase diffusion is described. The insulating film 23 is formed on the undoped current blocking layer 21, the stripe-shaped portion 22a is removed at the upper part of ridge, and vapor phase diffusion of Zn is performed. Zn is diffused into the upper part of the ridge (FIG. 5(c)).

In solid phase diffusion, ZnO or ZnO/SiO is formed on the undoped current blocking layer, a stripe-shaped mask is formed at the upper part of the ridge, and Zn is diffused into the upper part of ridge.

The current blocking layer 21 in embodiment 2 comprises a multi-layer structure, for example, pGaAs/i-GaInP (i designates undoped), i-GaInP/i-AlGaInP, and p-GaAs/i-GaInP/i-AlGaInP.

In the method of fabricating a semiconductor laser according to embodiment 2, after forming the ridge as in embodiment 1, the mask 17 is removed, and the p type GaAs cap layer 8 is etched using the tartaric acid series etchant. Thereafter, the entire ridge is buried by the undoped GaInP layer 21, Zn is diffused into the upper part of ridge, a p type GaAs contact layer 14 is grown, and an LD is formed. The band discontinuity relaxing layer need not be grown, and a laser structure including a ridge is formed accurately and easily. In this method, the processing precision of the laser is increased.

EMBODIMENT 3

Embodiment 3 relates to a method of fabricating an LD in which the fabrication process, after the entire ridge is buried by the current blocking layer, is changed from embodiment 2.

FIGS. 6(a)–6(e) are diagrams illustrating fabrication process steps of embodiment 3. The same reference numerals as those in FIGS. 1(a)–1(g) designate the same or corresponding elements. A description is given of the fabrication process. A DH which does not include the band discontinuity relaxing layer, as mentioned above, is grown, and the ridge is formed. Thereafter, the mask 17 is removed, and the p type GaAs cap layer 8 is etched with the tartaric acid series etchant (FIG. 6(a)).

Figure 6:
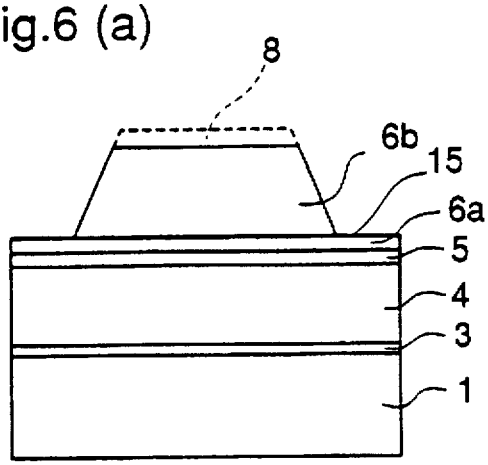
FIGS. 6(a)–6(e) are diagrams illustrating steps in fabricating a semiconductor laser according to an alternative of the second embodiment of the invention.
Figure 6:
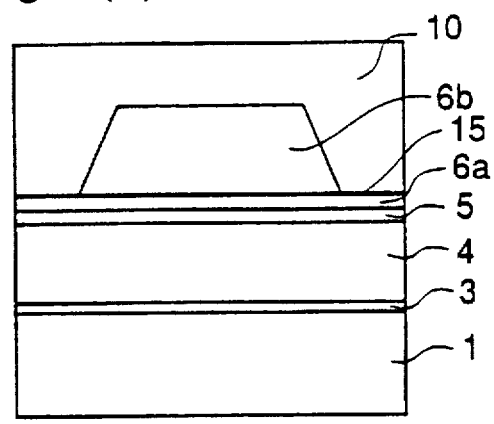
Figure 6:
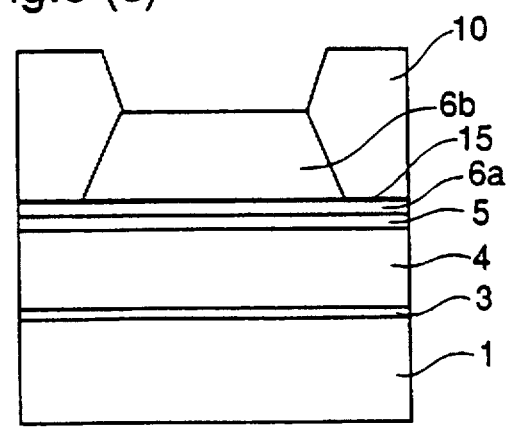
Figure 6:
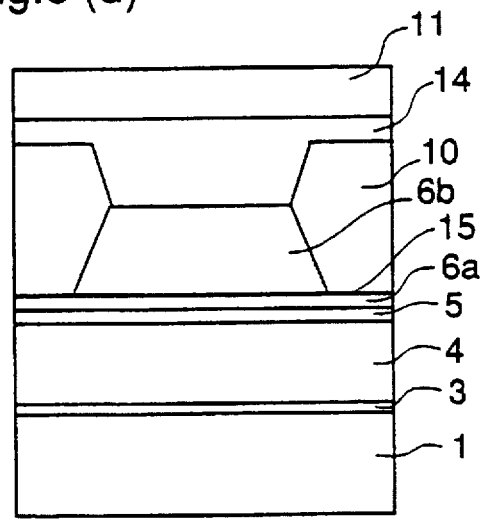
Figure 6:
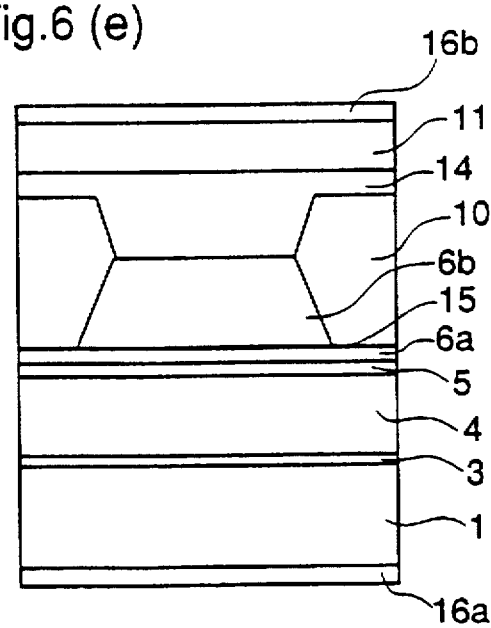
Figure 7:
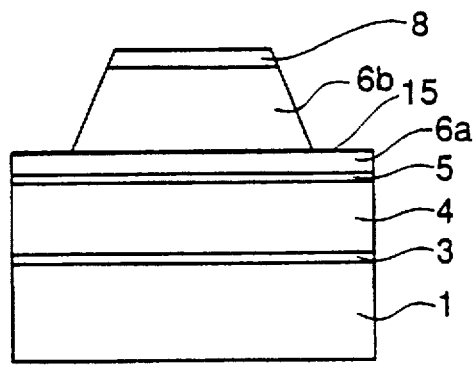
FIGS. 7(a)–7(f) are diagrams illustrating steps in fabricating a semiconductor laser according to a third embodiment of the invention.
Figure 7:
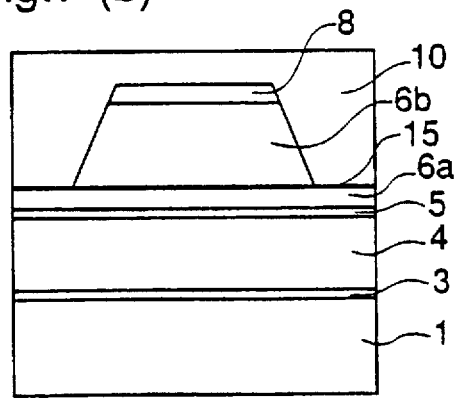
Figure 7:
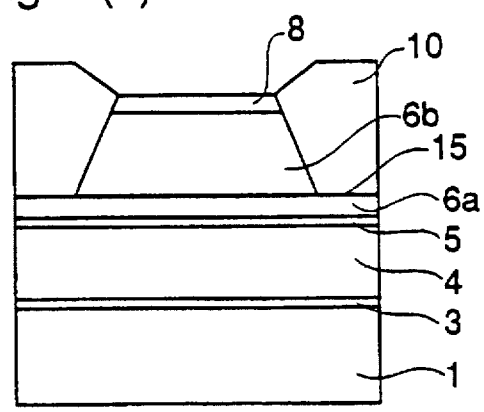
Figure 7:
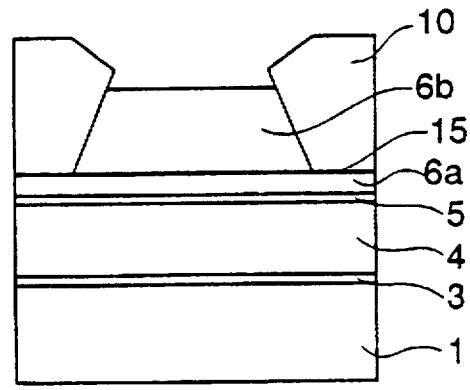
Figure 7:
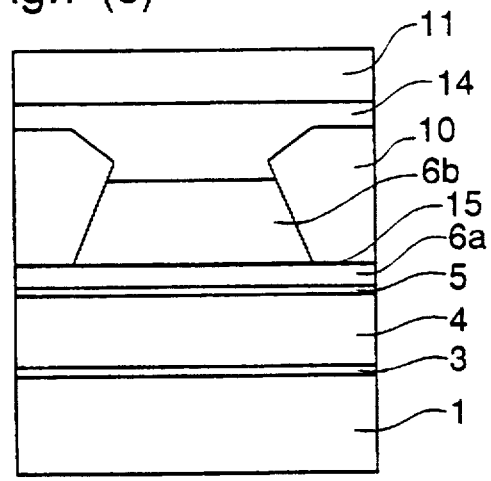
Figure 7:
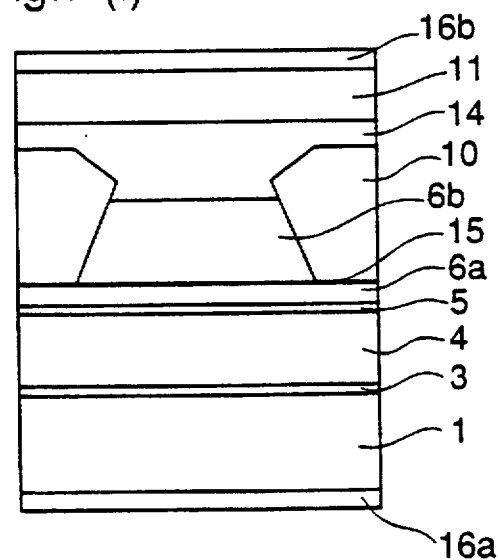

The entire ridge is buried by the current blocking layer 10 (FIG. 6(b)). Then, the current blocking layer 10 at the upper part of the ridge is removed by etching to expose the cladding layer 6b (FIG. 6(c)).

The p type GaInP band discontinuity relaxing layer 14 and the p type GaAs contact layer 11 are grown (FIG. 6(d)). The current blocking layer 10 of embodiment 1 or having the same structures as those described as alternatives are used for this current blocking layer 10.

In the method of fabricating the semiconductor laser in embodiment 3, after the ridge is formed as in embodiment 1, the mask 17 is removed and the p type GaAs cap layer 8 is etched with a tartaric acid series etchant. Thereafter, the entire ridge is buried by the current blocking layer 10, and the current blocking layer 10 of the upper part of the ridge is etched to the surface of the second p type AlGaInP cladding layer 6b of the upper surface of the ridge. Then, the p type GaInP band discontinuity relaxing layer 14 and the p type GaAs contact layer 11 are grown, whereby a laser structure in which a ridge is formed accurately and easily, a method for fabricating the semiconductor laser in which the processing precision is increased, and a semiconductor laser fabricated by the method are achieved.

EMBODIMENT 4

In embodiment 4, an LD that has the entire ridge buried by the current blocking layer 10 is fabricated, and a description is given of the fabrication process.

FIGS. 7(a)–7(f) are diagrams illustrating process steps of embodiment 4, and the same reference numerals as those in FIGS. 1(a)–1(g) designate the same or corresponding elements. A description is given of the fabrication process. First of all, a DH that does not include a band discontinuity relaxing layer is grown, and the ridge is formed. The mask 17 is removed (FIG. 7(a)).

The entire ridge is buried by the current blocking layer 10 (FIG. 7(b)). The current blocking layer 10 at the upper part of the ridge is etched to the surface of the p type GaAs cap layer 8. An etchant that selectively etches the current blocking layer 10, but not the p type GaAs cap layer 8, is used so the etching stops at the p type GaAs cap layer 8 (FIG. 7(c)).

The p type GaAs cap layer 8 is etched with the tartaric acid series etchant to expose the p type AlGaInP layer 6b. This etching is stopped accurately at the surface of the p type AlGaInP cladding layer 6b (FIG. 7 (d)).

The p type GaInP band discontinuity relaxing layer 14 and the p type GaAs contact layer 11 are grown. The current blocking layer 10 of embodiment 1 or the same structures as the alternatives are used for this current blocking layer 10. Lastly, the electrodes 16a and 16b are formed (FIG. 7(f)), and the wafer is separated into LD elements.

In the method of fabricating the semiconductor laser according to embodiment 4, after the ridge is formed as in embodiment 1, the mask 17 is removed, the entire ridge is buried by the current blocking layer 10, the current blocking layer 10 of the upper part of ridge is etched to the cap layer 8, and then the cap layer 8 is removed by selective etching, using the tartaric acid series etchant, to expose the surface of the cladding layer 6b. Then, the p type GaInP band discontinuity relaxing layer 14 and p type GaAs contact layer 11 are grown, whereby a laser structure in which a ridge is formed accurately and easily, a method for fabricating the semiconductor laser in which processing precision is increased, and a semiconductor laser fabricated by the method are obtained.

EMBODIMENT 5

Figure 8:
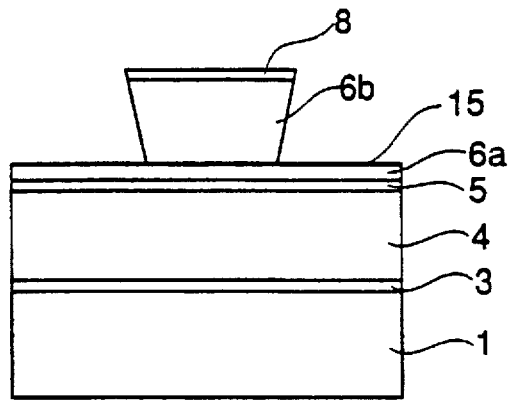
FIG. 8 is a diagram illustrating a step in fabricating a semiconductor laser according to a fourth embodiment of the invention.

In the fifth embodiment of the present invention, the stripe direction is changed. FIG. 8 shows a sectional view of an LD in which the stripe direction has a reverse mesa, i.e., [011], direction and the ridge is formed according to embodiment 5. The same reference numerals as those in FIGS. 1(a)–1(g) designate the same or corresponding elements.

The DH described in embodiment 1, which does not include the band discontinuity relaxing layer, is grown. Thereafter, the stripe direction is made the reverse mesa, i.e., [011], direction when the mask is formed, whereby the cross-sectional form of the ridge is a reverse trapezoid, as shown in FIG. 8. Thereafter, the LD is fabricated by the same process as when the stripe direction is the forward mesa direction, i.e., as in embodiments 1 to 4.

In the step of FIG. 8, the stripe direction is the reverse mesa, i.e., [011], direction, while when the stripe direction is [001] or [010], a side face of the ridge is perpendicular to the substrate 1.

In the method of fabricating the semiconductor laser according to embodiment 5, since the stripe direction is the reverse mesa, i.e., [011], direction, or the [001] or [010] directions, the ridge has a cross-sectional reverse trapezoidal or rectangular form. The semiconductor laser having a different cross-sectional form ridge is fabricated through the same processes as when the stripe direction is the forward mesa direction as in embodiments 1 to 4. The ridge form can be selected in accordance with the object of each LD, for example, for a window structure.

EMBODIMENT 6

Figure 9:
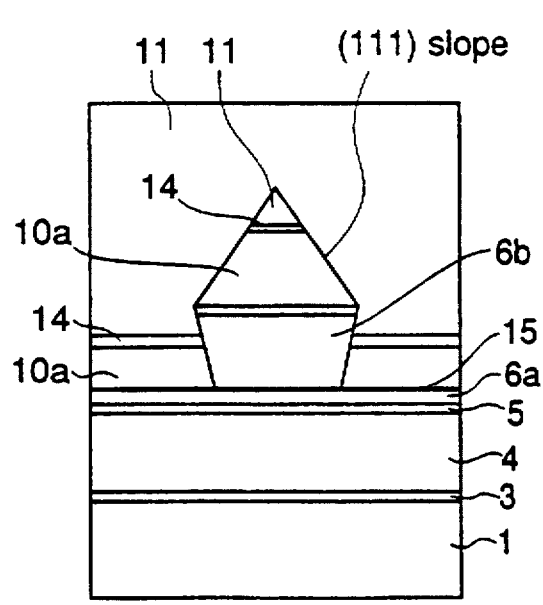
FIGS. 9(a)–9(b) are diagrams illustrating steps in fabricating a semiconductor laser according to a fifth embodiment of the invention.
Figure 9:
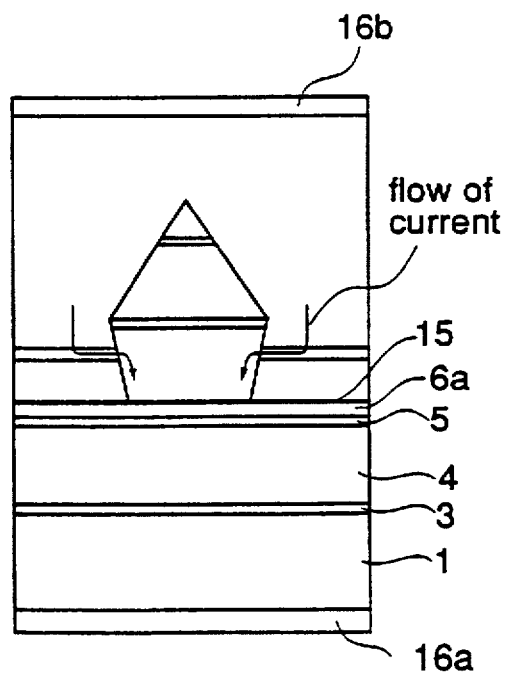
Figure 11:
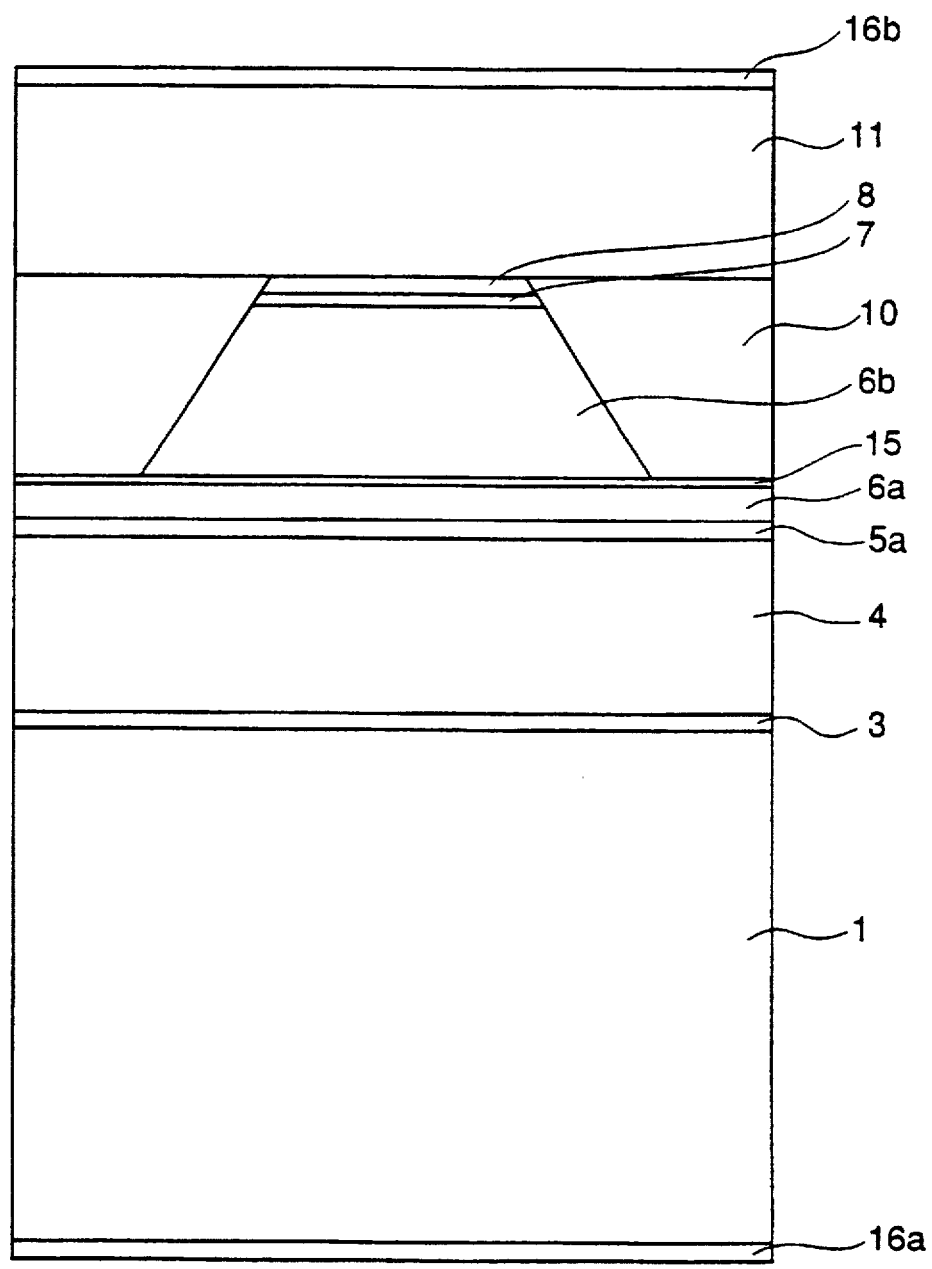
FIG. 11 is a sectional view illustrating the structure of a prior art semiconductor laser.

A sixth embodiment of the present invention is shown in FIGS. 9(a) and 9(b). Embodiment 6 relates to an LD fabricated in two crystal growth steps, and the stripe direction of a DH structure is the reverse mesa, i.e., [011], direction. A description is given of the fabrication process.

A DH that does not include the band discontinuity relaxing layer is grown, and the ridge stripe direction is the reverse mesa, i.e., [011], direction. The ridge has the cross-sectional form of a reverse triangle. Thereafter, the mask is removed (FIG. 8), the n type GaAs current blocking layer 10a, the p type GaInP band discontinuity relaxing layer 14, and the p type GaAs contact layer 11 are successively grown, and the ridge is buried. At this time, the surface of the etch stopping layer 15 is planar at the upper part of ridge, and an inclined [111] surface is formed. Since the growth speed on this surface is very slow, the material grown on top of the ridge becomes triangular and growth stops. Thereafter, the growth of the plane portion overtakes the ridge, and the ridge is buried, resulting in FIG. 9(a).

In this structure, the current flows from the contact layer 11 via the band discontinuity relaxing layer 14 to the p type AlGaInP cladding layer 6b and the active layer 5, taking the course shown by the arrows in FIG. 9(b).

N type GaAs is used as the current blocking layer 10a in this embodiment 6, while an n type $Al_xGa_{(1-x)}InP$ layer ($0 \leq x \leq 1$) or a high resistance $Al_xGa_{(1-x)}InP$ can be used instead of n type GaAs as an alternative 1. Here, the high resistance layer is undoped $Al_xGa_{(1-x)}InP$ or $Al_xGa_{(1-x)}InP$ including oxygen, and the Al composition x of $Al_xGa_{(1-x)}InP$ is $0 \leq x \leq 1$. The oxygen concentration is more than $10^{16}/cm^3$.

For example, an n type material, i.e., n type $Al_xGa_{(1-x)}As$, n type InP, or a high resistance layer, i.e., undoped $Al_xGa_{(1-x)}As$, $Al_xGa_{(1-x)}As$ including oxygen, $Al_xIn_{(1-x)}As$, or Fe doped InP, can be used.

As an alternative 2, the multi-layer structure can be used as the current blocking layer 10. For example, a current blocking layer that has the structure described as alternatives 1 and 4 of the current blocking layer 10 in embodiment 1 can be applied.

As an alternative 3 for this embodiment, the current blocking layer has a two-layer structure in which an $Al_xGa_{(1-x)}InP$ ($0 \leq x \leq 1$) layer and an n type material or a high resistance material are combined. For example, the high resistance semiconductor is combined with an n type material, i.e., $Al_xGa_{(1-x)}InP$/an n type semiconductor, $Al_xGa_{(1-x)}InP$/n type GaAs layer, or $Al_xGa_{(1-x)}InP$/n type $Al_xGa_{(1-x)}As$.

This structure is combined with a high resistance semiconductor material, i.e., $Al_xGa_{(1-x)}InP$/high resistance semiconductor material is $Al_xGa_{(1-x)}InP$/undoped $Al_xGa_{(1-x)}As$, $Al_xGa_{(1-x)}InP$/$Al_xGa_{(1-x)}As$ including oxygen, $Al_xGa_{(1-x)}InP$/$Al_xIn_{(1-x)}As$, or $Al_xGa_{(1-x)}InP$/Fe doped InP. Here, the built-up sequence of the current blocking layer can be reversed. Although the current blocking layer has a two-layer structure, a multi-layer structure in which the two-layer structure is repeated more than twice can be used.

Since the layer structure of the current blocking layer is a multi-layer structure or a superlattice structure, it is possible to adjust the thickness of each layer to control light confining efficiency in the transverse direction and to increase light emission efficiency of the laser.

In the method of fabricating a semiconductor laser according to embodiment 6, a DH that does not include a band discontinuity relaxing layer is grown, and a mask stripe in the reverse mesa, i.e., |011|, direction is formed. The ridge is formed by selective etching using the mask 17, and, after the mask is removed, the n type GaAs current blocking layer 10a, the p type GaInP band discontinuity relaxing layer 14, and the p type GaAs contact layer 11 are successively grown. Thus, an LD is formed through a two-step growth process, so that the process can be simple, the ridge is formed accurately and easily, processing precision is increased, and a semiconductor laser is obtained.

EMBODIMENT 7

In the method of fabricating an LD in embodiments 1 to 6, p type GaAs is used as a contact layer. In embodiment 7, p type Ge that lattice-matches with the GaAs substrate is used instead, and the structure of the active layer is as follows.

Generally, the basic composition of active layers of lasers producing visible light is $Al_xGa_{(1-x)}InP$ ($0 \leq x \leq 1$), and the active layer has a quantum well structure, an SQW (single quantum well), a DQW (double quantum well), or an MQW (multi quantum well) structure. Further, an SCH structure (separate confined heterostructure) or a structure in which an active layer and MQB (multi quantum barrier) are combined may be used as the active layer. A structure in which the active layer (well and barrier layers) is strained may also be used. P type GaInP or p type AlGaAs or the like are used for the band discontinuity relaxing layer.

In the method of fabricating the semiconductor laser according to embodiment 7, the resistance of the contact layer is small because p type Ge is used as the contact layer, whereby it becomes easier to make contact with an electrode. In this method, fabrication efficiency is increased since the active layer has the described structure, processing precision of the laser is increased, and a semiconductor laser is fabricated.

EMBODIMENT 8

In the described embodiments, AlGaInP series materials are the materials of the laser producing visible light. The method of preventing the p type layer from being subjected to the hydrogen passivation, described as the alternatives to embodiment 1, can be applied to a laser with AlGaAs series materials producing short wavelength light or to InP series materials producing long wavelength light, by changing the materials.

In embodiment 1, hydrogen passivation of Zn-doped AlGaInP is described. The electrical activation of the acceptor and donor impurities is subject to hydrogen passivation in other semiconductors, as stated in published articles. For example, as the acceptor or donor, Zn, Be, Cd, Si, or the like may be used, and as the semiconductor material, GaAs, AlGaAs, AlInAs, GaInAs, InP, InGaAsP, GaInP, AlGaP, GaP, Ge, or the like may be used. The fabrication method can also be applied to these compound semiconductor materials.

A description is given of an example in which Zn-doped InP is used as a material and $PH_3$ is cut off at a predetermined temperature. On the InP substrate, p type InP is grown by MOCVD. $PH_3$ is decomposed into P and a hydrogen radical, and the hydrogen radical enters and leaves the vapor phase and the InP crystal freely during InP growth. The temperature is decreased while supplying $PH_3$ to prevent P from being desorbed from InP after completing the growth. The hydrogen radicals form H—P bonds by breaking Zn—P bonds and revert to hydrogen radicals by breaking H—P bonds at a sufficiently high temperature.

While the temperature falls gradually, $PH_3$ is decomposed into P and a hydrogen radical. The hydrogen radical in the vapor phase is supplied to the semiconductor material. However, a reaction in which hydrogen radicals are generated by breaking H—P bonds in the semiconductor material, through a reduction of the kinetic energy of the respective atoms, following cooling, is suppressed, and H—P bonds remain intact in the semiconductor material.

Thus, since the Zn—P bonds are broken by hydrogen radicals, activation of Zn is prevented. After the crystalline semiconductor material is grown, the electrically activated proportion of Zn is increased by increasing the temperature at which $PH_3$ flow is stopped to a temperature higher than that at which hydrogen passivation does not occur during cooling.

According to this embodiment 8, the same result as embodiments 1 to 7 is obtained by changing the materials between AlGaAs series and InP series materials. The method for fabricating the semiconductor laser can also be applied to combinations of the other doped materials subject to the hydrogen passivation.

In the fabricating method, lowering of the electrically activated proportion of the dopant atoms by hydrogen passivation is prevented, as described in embodiments 1 to 8. Although examples are for the fabrication of an LD, the fabricating method can also be applied to other semiconductor devices, for example, transistors, electron transfer devices, and solar cells, by changing the materials.

What is claimed is:

1. A method of fabricating a semiconductor laser comprising a double heterostructure (DH) including:

on a GaAs substrate, growing a DH comprising an n type GaAs buffer layer, an n type AlGaInP cladding layer, an $Al_xGa_{(1-x)}InP$ active layer, a first p type AlGaInP cladding layer, a p type GaInP etching stopping layer, a second p type AlGaInP cladding layer, and a p type GaAs cap layer disposed directly on the second p type AlGaInP cladding layer;

forming a stripe-shaped mask on said DH;

selectively etching and a removing part of said p type GaAs cap layer using said mask as an etching mask; and selectively etching said second p type AlGaInP cladding layer to expose said p type GaInP etching stopping layer and form a stripe-shaped ridge.

2. The method of claim 1 comprising:

forming said stripe-shaped ridge in a forward mesa direction;

after forming said stripe-shaped ridge, selectively growing $Al_xGa_{(1-x)}InP$ current blocking layers on both sides of said stripe-shaped ridge and thereafter removing said mask;

selectively etching and removing said p type GaAs cap layer; and successively growing a p type GaInP band discontinuity relaxing layer and a p type GaAs contact layer on said second cladding and current blocking layers.

3. The method of claim 2 wherein during one of growth of said p type GaAs cap layer and said p type GaAs contact layer and falling of the temperature after the growth, no material source gas that generates hydrogen radicals and includes an element of the semiconductor layers is supplied to the cap layer.

4. The method of claim 3 wherein during growth of said p type GaAs cap layer and said p type GaAs contact layer and during falling of the temperature, stopping supply of hydrides of elements forming said semiconductor layers.

5. The method of claim 3 including, after the growth of said p type GaAs cap layer and said p type GaAs contact layer, supplying an organometallic compound including an element that does not generate hydrogen radicals and included in said semiconductor layers as an ambient to prevent the element from being desorbed from said semiconductor layers.

6. The method of claim 5 wherein said semiconductor crystal comprises GaAs and said organometallic compound material is trimethyl arsine (TMAs) or tributyl arsine (TBAs).

7. The method of claim 3 including, during epitaxially growing said p type GaAs cap layer and said p type GaAs contact layer, supplying an organometallic compound including an element that does not generate hydrogen radicals as an ambient.

8. The method of claim 3 including growing said p type GaAs cap layer and said p type GaAs contact layer by molecular beam epitaxy.

9. The method of claim 2 wherein said current blocking layers comprise n type $Al_xGa_{(1-x)}InP$ ($0 \leq x \leq 1$).

10. The method of claim 2 wherein said current blocking layers comprise $Al_xGa_{(1-x)}InP$ ($0 \leq x \leq 1$) having a high resistance.

11. The method of claim 2 wherein said current blocking layers comprise a two-layer structure including a semiconductor layer that is not etched when said p type GaAs cap layer is etched.

12. The method of claim 2 wherein said current blocking layer has a repeating two-layer structure including a semiconductor layer that is not etched when said p type GaAs cap layer is etched.

13. The method of claim 2 wherein said current blocking layer has a structure including a semiconductor layer that is not etched when said p type GaAs cap layer is etched and a multi-layer structure or superlattice structure.

14. The method of claim 13 wherein said current blocking layer comprises a layer of $Al_xGa_{(1-x)}InP$ and a layer of GaAs.

15. The method of claim 2 including forming said stripe-shaped mask in the [011] direction.

16. The method of claim 1 comprising:

after forming said ridge, removing said mask;

selectively etching and removing said p type GaAs cap layer;

growing an undoped GaInP layer burying said ridge;

diffusing Zn into said undoped GaInP layer opposite said ridge; and growing a p type GaAs contact layer on said undoped GaInP layer into which Zn has been diffused.

17. The method of claim 1 comprising:

after forming said ridge, removing said mask;

selectively etching and removing said p type GaAs cap layer;

growing a current blocking layer burying said ridge;

etching said current blocking layer opposite said ridge to expose said second p type AlGaInP cladding layer; and growing a p type GaInP band discontinuity relaxing layer and a p type GaAs contact layer on said second p type AlGaInP cladding layer.

18. The method of claim 1 comprising:

after forming said ridge, removing said mask;

growing a current blocking layer burying said ridge;

removing said current blocking layer opposite said ridge to expose said cap layer;

selectively etching and removing said cap layer to expose said second p type AlGaInP cladding layer; and growing a p type GaInP band discontinuity relaxing layer and a p type GaAs contact layer on said second p type AlGaInP cladding layer.

19. The method of claim 1 including selectively etching and removing said p type GaAs cap layer with tartaric acid, and etching said p type AlGaInP cladding layer to said p type GaInP etch stopping layer with sulfuric acid.

20. The method of claim 1 comprising:

after growing said DH, forming said stripe-shaped mask in the [011] direction;

forming a ridge by the selective etching;

removing said mask; and successively growing an n type GaAs current blocking layer, a p type GaInP band discontinuity relaxing layer, and a p type GaAs contact layer.

* * * * *

UNITED STATES PATENT AND TRADEMARK OFFICE
CERTIFICATE OF CORRECTION

PATENT NO. : 5,763,291
DATED : June 9, 1998
INVENTOR(S) : Motoda et al.

It is certified that error appears in the above-identified patent and that said Letters Patent is hereby corrected as shown below:

Column 17, Line 12, after "and" insert --is--;

Column 18, Line 46, insert the following:

Signed and Sealed this

Twenty-sixth Day of January, 1999

Attest:

Attesting Officer

Acting Commissioner of Patents and Trademarks

UNITED STATES PATENT AND TRADEMARK OFFICE
CERTIFICATE OF CORRECTION

PATENT NO. : 5,763,291
DATED : June 9, 1998
INVENTOR(S) : Motoda et al.

It is certified that error appears in the above-identified patent and that said Letters Patent is hereby corrected as shown below:

<u>Column 18,</u>
Line 46, insert the following:
-- 21. The method of claim 2 wherein p type Ge is used as
    said contact layer. --.

Signed and Sealed this

Nineteenth Day of March, 2002

Attest:

JAMES E. ROGAN
*Director of the United States Patent and Trademark Office*

*Attesting Officer*